(12) United States Patent
Sekiguchi et al.

(10) Patent No.: US 9,287,174 B2
(45) Date of Patent: Mar. 15, 2016

(54) FIBER-CONTAINING RESIN SUBSTRATE, DEVICE-MOUNTING SUBSTRATE AND DEVICE-FORMING WAFER, SEMICONDUCTOR APPARATUS, AND METHOD FOR PRODUCING SEMICONDUCTOR APPARATUS

(71) Applicant: SHIN-ETSU CHEMICAL CO., LTD., Tokyo (JP)

(72) Inventors: Susumu Sekiguchi, Takasaki (JP); Toshio Shiobara, Annaka (JP); Hideki Akiba, Annaka (JP); Tomoaki Nakamura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/080,319

(22) Filed: Nov. 14, 2013

(65) Prior Publication Data
US 2014/0138856 A1    May 22, 2014

(30) Foreign Application Priority Data

Nov. 19, 2012  (JP) ................. 2012-252884

(51) Int. Cl.
*H01L 23/29* (2006.01)
*H01L 21/78* (2006.01)
(Continued)

(52) U.S. Cl.
CPC ............. *H01L 21/78* (2013.01); *C03C 25/26* (2013.01); *C08J 5/08* (2013.01); *H01L 21/561* (2013.01); *H01L 23/295* (2013.01); *H01L 23/3135* (2013.01); *H01L 24/97* (2013.01); *H01L 2224/32225* (2013.01); *H01L 2224/97* (2013.01); *H01L 2924/15788* (2013.01); *H01L 2924/181* (2013.01); *Y10T 442/2041* (2015.04)

(58) Field of Classification Search
CPC ..... H01L 21/561; H01L 21/568; H01L 24/97; H01L 23/293; H01L 2924/0253; H01L 23/3135; H01L 21/78; Y10T 428/24942
See application file for complete search history.

(56) References Cited

U.S. PATENT DOCUMENTS

2003/0127750 A1    7/2003    Hacke et al.
2004/0115868 A1*   6/2004    Ono ........................... 438/127
(Continued)

FOREIGN PATENT DOCUMENTS

JP    A-2002-179885    6/2002
JP    A-2004-504723    2/2004
(Continued)

OTHER PUBLICATIONS

Sep. 8, 2015 Office Action issued in Japanese Application No. 2012-252884.

*Primary Examiner* — A. Sefer
(74) *Attorney, Agent, or Firm* — Oliff PLC

(57) ABSTRACT

A fiber-containing resin substrate for collectively encapsulating a semiconductor-device-mounting surface of a substrate on which semiconductor devices are mounted or a semiconductor-device-forming surface of a wafer on which a semiconductor device is formed, including a resin-impregnated fibrous base material which is obtained by impregnating a fibrous base material with a thermosetting resin and semi-curing or curing the thermosetting resin and has a linear expansion coefficient (ppm/° C.) in an X-Y direction of less than 3 ppm, and an uncured resin layer formed of an uncured thermosetting resin on one side of the resin-impregnated fibrous base material.

4 Claims, 6 Drawing Sheets

(51) Int. Cl.
  *H01L 21/56* (2006.01)
  *H01L 23/31* (2006.01)
  *H01L 23/00* (2006.01)
  *C03C 25/26* (2006.01)
  *C08J 5/08* (2006.01)

(56) References Cited

U.S. PATENT DOCUMENTS

| | | | | |
|---|---|---|---|---|
| 2010/0270059 A1* | 10/2010 | Takeuchi et al. | ............. | 174/254 |
| 2012/0161339 A1* | 6/2012 | Sekiguchi et al. | ............. | 257/791 |
| 2013/0200534 A1* | 8/2013 | Shiobara et al. | ............... | 257/787 |
| 2014/0138857 A1* | 5/2014 | Akiba et al. | ................... | 257/791 |
| 2014/0264956 A1* | 9/2014 | Shiobara et al. | ............... | 257/787 |

FOREIGN PATENT DOCUMENTS

| | | |
|---|---|---|
| JP | 2005-060584 A | 3/2005 |
| JP | A-2007-001266 | 1/2007 |
| JP | A-2009-060146 | 3/2009 |
| JP | 2011-243801 A | 12/2011 |
| JP | 2012-151451 A | 8/2012 |
| JP | 2012-174861 A | 9/2012 |
| WO | WO 02/07209 A1 | 1/2002 |

* cited by examiner (A) COVERING (B) ENCAPSULATING (C) CUTTING (D)

FIBER-CONTAINING RESIN SUBSTRATE, DEVICE-MOUNTING SUBSTRATE AND DEVICE-FORMING WAFER, SEMICONDUCTOR APPARATUS, AND METHOD FOR PRODUCING SEMICONDUCTOR APPARATUS

BACKGROUND OF THE INVENTION

1. Field of the Invention

The present invention relates to an encapsulant capable of collective encapsulation on a wafer level, particularly to an encapsulant substrate, a semiconductor-device-mounting substrate and a semiconductor-device-forming wafer that are both encapsulated with the encapsulant substrate, an individual semiconductor apparatus cut from the semiconductor-device-mounting substrate or the semiconductor-device-forming wafer, and a method for producing a semiconductor apparatus using the encapsulant substrate.

2. Description of the Related Art

Various methods have been proposed and studied for encapsulating, on a wafer level, a semiconductor-device-mounting surface (also simply referred to as a device-mounting surface, hereinafter) of a substrate on which semiconductor devices are mounted, or a semiconductor-device-forming surface (also simply referred to as a device-forming surface, hereinafter) of a wafer on which semiconductor devices are formed. Example of these methods include encapsulation by spin coating, encapsulation by screen printing (Patent Document 1), and use of a composite sheet obtained by coating a film support with a hot-melt epoxy resin (Patent Documents 2 and 3).

Among these methods, the following method has been put in practical use to encapsulate the device-mounting surface of a substrate on which semiconductor devices are mounted (also referred to as a semiconductor-device-mounting substrate, or simply a device-mounting substrate, hereinafter): A film with an adhesive layer provided each on its both sides is attached to, or an adhesive is applied by spin coating to an upper part of a metal substrate, a silicon-wafer substrate, or a glass substrate; semiconductor devices are then mounted on the device-mounting surface of the substrate by arranging and bonding the devices; and the device-mounting surface is then encapsulated with a liquid epoxy resin or an epoxy molding compound by compression molding under a heated condition (Patent Document 4). Similarly, a method, involving encapsulating the device-forming surface with a liquid epoxy resin or an epoxy molding compound by compression molding under a heated condition, has been put in practical use to encapsulate the device-forming surface of a wafer on which semiconductor devices are formed (also referred to as a semiconductor-device-forming wafer, or simply a device-forming wafer, hereinafter).

Such methods enable encapsulation of a wafer or a substrate, such as a metal substrate, having a small diameter, e.g., about 200 mm (8 inches) without a serious problem, whereas encapsulation of the device-mounting surface or device-forming surface of a wafer or a substrate having a large diameter, e.g., 300 mm (12 inches) or more according to these methods brings a serious problem in that the substrate or the wafer is warped, or the wafer is damaged, owing to contraction stress of a resin, such as an epoxy resin, during curing for the encapsulation. Such contraction stress may disadvantageously cause some of the devices to peel away from the substrate during encapsulating the device-mounting surface of a large-diameter substrate on a wafer level, thereby making mass production impossible. In particular, a thin, large-diameter wafer is susceptible to breaking during encapsulating the wafer.

For the purpose of avoiding these problems against a device-mounting substrate or a device-forming wafer, having a large diameter, it is known to lower the contraction stress upon curing by using a resin composition for encapsulation with a filler added thereto by about 90% by mass, or a resin composition for encapsulation with lower elasticity (Patent Documents 1, 2, and 3).

Unfortunately, such methods, for lowering the contraction stress, brings new problems as follows: Adding a filler by about 90% by mass to a resin composition for encapsulation increases the viscosity of the composition, resulting in an increasing force exerting on semiconductor devices, mounted on the substrate when the composition is casted and molded for the encapsulation, so that some of the semiconductor devices are peeled away from the substrate; Using the resin composition for encapsulation with lower elasticity leads to low encapsulation performance, such as heat resistance and humidity resistance, although it suppresses warping of the encapsulated device-mounting substrate or device-forming wafer. These conventional methods thus cannot solve the problems fundamentally. There is therefore a need for an encapsulant that has excellent encapsulation performance, such as heat resistance and humidity resistance after encapsulation, and enables the device-mounting surface of a substrate or the device-forming surface of a wafer to be collectively encapsulated on a wafer level without warp of the substrate or wafer and peeling of a semiconductor device away from the substrate, even when a large-diameter wafer or a large-diameter substrate such as a metal substrate is encapsulated.

CITATION LIST

Patent Literature

[Patent Document 1] Japanese Patent Application Publication No. 2002-179885
[Patent Document 2] Japanese Patent Application Publication No. 2009-60146
[Patent Document 3] Japanese Patent Application Publication No. 2007-001266
[Patent Document 4] Japanese Unexamined Patent Application Publication (Translation of PCT Application) No. 2004-504723

SUMMARY OF THE INVENTION

The present invention has been made to solve the problems. It is an object of the invention to provide a fiber-containing resin substrate that has a high versatility and excellent encapsulation performance, such as heat resistance and humidity resistance after encapsulation, and enables the device-mounting surface of a substrate or the device-forming surface of a wafer to be collectively encapsulated on a wafer level, while suppressing warping of the substrate or the wafer, peeling of a semiconductor device from a substrate, and damage of a wafer, particularly even when the substrate is a large-diameter metal substrate, and the wafer is a large-diameter, thin wafer. Another of the present invention is to provide an encapsulated semiconductor-device-mounting substrate and an encapsulated semiconductor-device-forming wafer that are encapsulated with the fiber-containing resin substrate, a semiconductor apparatus cut from the encapsulated semiconductor-device-mounting substrate or the encapsulated semiconductor-device-mounting substrate, and a method for producing a semiconductor apparatus using the fiber-containing resin substrate.

In order to achieve the objects, the present invention provides a fiber-containing resin substrate for collectively encapsulating a semiconductor-device-mounting surface of a substrate on which semiconductor devices are mounted or a semiconductor-device-forming surface of a wafer on which a semiconductor device is formed, the resin substrate comprising a resin-impregnated fibrous base material obtained by impregnating a fibrous base material with a thermosetting resin and semi-curing or curing the thermosetting resin, the resin-impregnated fibrous base material having a linear expansion coefficient (ppm/° C.) in an X-Y direction of less than 3 ppm, and an uncured resin layer formed of an uncured thermosetting resin on one side of the resin-impregnated fibrous base material.

Such a fiber-containing resin substrate can strongly suppress the contraction stress of a resin layer during curing by the resin-impregnated fibrous base material, which has a very small expansion coefficient, thereby suppressing warping of the substrate or the wafer, peeling of the semiconductor devices from the substrate, and damage of the wafer, during collectively encapsulating the device-mounting surface of the substrate or the device-forming surface of the wafer on a wafer level, particularly even when a large-diameter metal substrate or a large-diameter wafer is encapsulated. In addition, the fiber-containing resin substrate is a very versatile and exhibits excellent encapsulation performance, such as heat resistance and humidity resistance after encapsulation.

The uncured resin layer preferably has a thickness ranging from 20 μm to 2,000 μm.

The thickness of 20 μm or more is sufficient to encapsulate the device-mounting surface of the substrate or the device-forming surface of the wafer and suppress filling failure, which is expected in the case of excessively thin thickness. The thickness of 2,000 μm or less is sufficient to prevent the encapsulated semiconductor-device-mounting substrate or the encapsulated semiconductor-device-forming wafer to becoming excessively thick.

The uncured resin layer is preferably formed of a thermosetting resin that is solidified at temperatures lower than 50° C. and molten at temperatures ranging from 50° C. to 150° C.

Such a fiber-containing resin substrate is such a versatile that the uncured resin layer can maintain a uniform thickness without deformation of the uncured resin layer when the fiber-containing resin substrate is stacked on a large-diameter wafer or a large substrate at lower than 50° C.

The present invention provides an encapsulated semiconductor-device-mounting substrate, wherein a semiconductor-device-mounting surface of a substrate on which semiconductor devices are mounted is covered with the uncured resin layer of the fiber-containing resin substrate of the present invention, and the uncured resin layer is heated and cured to collectively encapsulate the semiconductor-device-mounting surface with the fiber-containing resin substrate.

Such an encapsulated semiconductor-device-mounting substrate is prevented from warping and being damaged, and semiconductor devices mounted on the substrate are prevented from being peeled.

The present invention provides an encapsulated semiconductor-device-forming wafer, wherein a semiconductor-device-forming surface of a wafer on which a semiconductor device is formed is covered with the uncured resin layer of the fiber-containing resin substrate of the present invention, and the uncured resin layer is heated and cured to collectively encapsulate the semiconductor-device-forming surface with the fiber-containing resin substrate.

Such an encapsulated semiconductor-device-forming wafer is prevented from warping and being damaged.

The wafer may have a thickness ranging from 30 μm to 100 μm and a diameter of 300 mm or more.

Even when such a thin, large-diameter wafer is used, the fiber-containing resin substrate of the present invention prevents the wafer from being damaged.

Further, the present invention provides a semiconductor apparatus, cut by dicing from the encapsulated semiconductor-device-mounting substrate or the encapsulated semiconductor-device-forming wafer.

Such a semiconductor apparatus maintains high quality by being produced with a substrate or a wafer, which is prevented from warping and encapsulated with the fiber-containing resin substrate exhibiting excellent encapsulation performance, such as heat resistance and humidity resistance after encapsulation.

Further, the present invention provides a method for producing a semiconductor apparatus, comprising the steps of: covering a semiconductor-device-mounting surface of a substrate on which semiconductor devices are mounted or a semiconductor-device-forming surface of a wafer on which a semiconductor device is formed with the uncured resin layer of the fiber-containing resin substrate of the present invention; encapsulating the semiconductor-device-mounting surface of the substrate or the semiconductor-device-forming surface of the wafer collectively by heating and curing the uncured resin layer to form an encapsulated semiconductor-device-mounting substrate or an encapsulated semiconductor-device-forming wafer; and cutting the encapsulated semiconductor-device-mounting substrate or the encapsulated semiconductor-device-forming wafer by dicing into individual pieces of the semiconductor apparatus.

According to such a method for producing a semiconductor apparatus, the device-mounting surface or the device-forming surface can be readily covered with the uncured resin layer of the fiber-containing resin substrate of the present invention without a failure in filling in the covering step. The method enables the contraction stress of the uncured resin layer to be suppressed during curing by using the resin-impregnated fibrous base material of the of fiber-containing resin substrate, thereby suppressing the warping of the encapsulated substrate or wafer, peeling of the semiconductor devices from the substrate, and the damage of the wafer, and enabling collective encapsulation of the device-mounting surface or the device-forming surface in the encapsulating step. The method can produce a high-quality semiconductor apparatus, because the semiconductor apparatus is cut by dicing into individual pieces from the encapsulated substrate or wafer, which is prevented from warping and encapsulated with the fiber-containing resin substrate exhibiting excellent encapsulation performance, such as heat resistance and humidity resistance after encapsulation, in the cutting step.

As described above, the fiber-containing resin substrate of the invention can suppress the contraction stress of the uncured resin layer during curing by the resin-impregnated fibrous base material, thereby suppressing warping of the substrate or the wafer, peeling of the semiconductor devices from the substrate, and damage of the wafer, during collectively encapsulating the device-mounting surface of the substrate or the device-forming surface of the wafer on a wafer level, particularly even when a large-diameter metal substrate or a large-diameter wafer is encapsulated. In addition, the fiber-containing resin substrate is a very versatile and exhibits excellent encapsulation performance, such as heat resistance and humidity resistance after encapsulation.

The semiconductor-device-mounting substrate and the semiconductor-device-forming wafer, which are encapsulated with the fiber-containing resin substrate, are prevented from warping and being damaged, and the semiconductor devices mounted on the substrate, such as a metal substrate, are prevented from being peeled. The semiconductor device cut from the encapsulated device-mounting substrate and device-forming wafer, which are prevented from warping and encapsulated with the fiber-containing resin substrate exhibiting excellent encapsulation performance, such as heat resistance and humidity resistance. The method can produce a high-quality semiconductor apparatus by using the fiber-containing resin substrate.

DETAILED DESCRIPTION OF THE PREFERRED EMBODIMENTS

Figure 1:
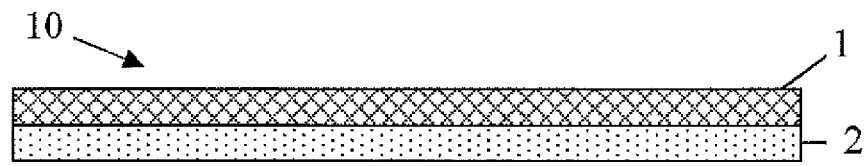
FIG. 1 is an example of a cross-sectional view of a fiber-containing resin substrate of the invention.

Hereinafter, a fiber-containing resin substrate, a semiconductor-device-mounting substrate and a semiconductor-device-forming wafer that are encapsulated with the fiber-containing resin substrate, an individual semiconductor apparatus cut from the encapsulated device-mounting substrate and device-forming wafer, and a method for producing a semiconductor apparatus using the fiber-containing resin substrate of the present invention will be described in detail. The present invention is not limited to them.

As described above, there is a need for a versatile encapsulant that has excellent encapsulation performance, such as heat resistance and humidity resistance after encapsulation, and enables the device-mounting surface of a substrate or the device-forming surface of a wafer to be collectively encapsulated on a wafer level without warp of the substrate and wafer, damage of the wafer, and peeling of a semiconductor device from the substrate, even when a large-diameter device-mounting substrate such as metal or a large-diameter device-forming wafer is encapsulated.

The present inventors have intensively studied to achieve the objects. As a result, the inventors contrived a fiber-containing resin substrate including a resin-impregnated fibrous base material that is obtained by impregnating a fibrous base material with a thermosetting resin and semi-curing or curing the thermosetting resin and has a linear expansion coefficient in an X-Y direction of less than 3 ppm, and an uncured resin layer formed of an uncured thermosetting resin on one side of the resin-impregnated fibrous base material. The resin-impregnated fibrous base material, which has a very small expansion coefficient, suppresses the contraction stress of a resin layer to be suppressed during curing, thereby preventing the substrate and wafer from warping, and enabling collective encapsulation on a wafer level with excellent encapsulation performance. Silicon, which is commonly used for a wafer, has a linear expansion coefficient of about 3 ppm. The resin-impregnated fibrous base material having a linear expansion coefficient in an X-Y direction of less than 3 ppm can surely prevent damage of a wafer, particularly a thin, large-diameter wafer having a diameter of 300 m or more and a thickness of 100 μm or less. The inventors thereby brought the fiber-containing resin substrate to completion.

The inventors also found the following: A semiconductor-device-mounting substrate and a semiconductor-device-forming wafer that are collectively encapsulated with the fiber-containing resin substrate of the invention are prevented from warping and being damaged, and the semiconductor devices mounted on the substrate are prevented from being peeled. A high-quality semiconductor device can be produced by cutting such a device-mounting substrate and a device-forming wafer into individual pieces. The inventors thereby brought the device-mounting substrate, the device-forming wafer, and the semiconductor apparatus to completion.

The inventors also found the following: Use of the fiber-containing resin substrate of the invention enables the device-mounting surface and the device-forming surface to be covered and collectively encapsulated in a simple operation. A high-quality semiconductor device can be produced by cutting into individual pieces such a device-mounting substrate and a device-forming wafer, encapsulated with the fiber-containing resin substrate having excellent encapsulation performance. The inventors thereby brought the method for producing a semiconductor apparatus to completion.

<Resin-Impregnated Fibrous Base Material>

The fiber-containing resin substrate of the present invention has a resin-impregnated fibrous base material. The resin-impregnated fibrous base material is obtained by impregnating a fibrous base material with a thermosetting resin and semi-curing or curing the thermosetting resin. The resin-impregnated fibrous base material has a linear expansion coefficient (ppm/° C.) in an X-Y direction of less than 3 ppm and thereby suppresses the contraction stresses during curing an uncured resin layer as described below. The resin-impregnated fibrous base material enables prevention of warping of the substrate and the wafer, peeling of the semiconductor device from the substrate, and damage of the wafer, even when the substrate is a large-diameter metal substrate and the wafer is a large-diameter wafer, particularly a thin, large-diameter wafer with a diameter of 300 mm or more and a thickness of 100 μm or less. The X-Y direction used herein means a plane direction of the resin-impregnated fibrous base material, and the linear expansion coefficient in the X-Y direction means a linear expansion coefficient measured at an optional position of an X-axis and a Y-axis in such a plane direction.

[Fibrous Base Material]

Examples of a material that can be used as the fibrous base material include an inorganic fiber such as a carbon fiber, a glass fiber, a quartz glass fiber, and a metal fiber, an organic fiber such as an aromatic polyamide fiber, a polyimide fiber, and a polyamideimide fiber, a silicon carbide fiber, a titanium carbide fiber, a boron fiber, and an alumina fiber. Any fibers can be used according to characteristic of a product. The fibrous base material is preferably a glass fiber, a quartz fiber, or a carbon fiber, more preferably a glass fiber having a high insulating property or a quartz glass fiber.

Examples of the form of the fibrous base material include sheet-shape such as a roving in which long fiber filament is uniformly arranged in a constant direction, a fibrous cloth, and a non-woven fabric, and a chopped strand mat. The form is not particularly limited as long as a layered body can be formed from the material.

[Thermosetting Resin]

Examples of the thermosetting resin of the resin-impregnated fibrous base material include an epoxy resin, a silicone resin, a phenolic resin, a cyanate resin, and a mixed resin of an epoxy resin and a silicone resin, which are described below. The thermosetting resin is not particularly limited as long as it can be generally used to encapsulate a semiconductor device.

[Method for Producing Resin-Impregnated Fibrous Base Material]

The fibrous base material may be impregnated with the thermosetting resin by either a solvent method or a hot melt method. The solvent method involves creating a resin varnish by dissolving the thermosetting resin in an organic solvent and impregnating the fibrous base material with the resin varnish. The hot melt method involves heating a solid thermosetting resin to dissolving the resin and impregnating the fibrous base material with the dissolved thermosetting resin.

The method of semi-curing the thermosetting resin impregnated into the fibrous base material may be, but not limited to, desolvation through heating the thermosetting resin. The method of curing the thermosetting resin impregnated into the fibrous base material may be, but not limited to, heating the thermosetting resin.

The thickness of the resin-impregnated fibrous base material after impregnating a fibrous base material with a thermosetting resin and semi-curing or curing the thermosetting resin is determined by the thickness of the fibrous base material such as a fibrous cloth to be used A plurality of fibrous base materials, such as fibrous cloths, are stacked to produce a thick resin-impregnated fibrous base material.

The term "semi-curing" used in the invention represents a B-stage status (a curing intermediate of a thermosetting resin) as defined in JIS K 6800 "Glossary of Terms Used in Adhesives and Adhesion". A resin in this state is softened by heating and swelled by contacting a certain solvent, but is not completely molten and dissolved.

In both cases where the thermosetting resin impregnated into a fibrous base material is semi-cured and cured, the thickness of the resin-impregnated fibrous base material is preferably 50 µm to 1 mm, and more preferably 50 µm to 500 µm. The resin-impregnated fibrous base material having a thickness of 50 µm or more can suppress its deformation due to thinness. The resin-impregnated fibrous base material having a thickness of 1 mm or less can prevent an increase in the thickness of a semiconductor apparatus itself.

The resin-impregnated fibrous base material is important to suppress warping of the encapsulated device-mounting surface of the device-mounting substrate and the encapsulated device-forming surface of the device-forming wafer and to reinforce the substrate on which one or more semiconductor devices are arranged and bonded. Accordingly, the resin-impregnated fibrous base material is preferably hard and rigid.

<Uncured Resin Layer>

The fiber-containing resin substrate of the present invention has an uncured resin layer. The uncured resin layer is composed of an uncured thermosetting resin formed on one side of the resin-impregnated fibrous base material. The uncured resin layer serves as a resin layer for encapsulating semiconductor devices.

The uncured resin layer preferably has a thickness ranging from 20 µm to 2,000 µm. The uncured resin layer having a thickness of 20 µm or more can sufficiently encapsulate the device-mounting surface and the device-forming surface, and prevent a failure in filling due to thinness. The uncured resin layer having a thickness of 2,000 µm or less prevents an excessive increase in the thickness of the encapsulated device-mounting substrate and device-forming wafer.

The uncured resin layer is not particularly limited, and preferably composed of a liquid or solid epoxy resin, a silicone resin, or a mixed resin of an epoxy resin and a silicone resin, which are generally used for encapsulating semiconductor devices. In particular, the uncured resin layer preferably contains any of the epoxy resin, the silicone resin, and the epoxy-silicone mixed resin which are solidified at temperatures lower than 50° C. and molten at temperatures ranging from 50° C. to 150° C.

[Epoxy Resin]

The epoxy resin is not particularly restricted. Examples thereof include a bisphenol type epoxy resin such as a bisphenol A type epoxy resin and a bisphenol F type epoxy resin, a biphenol type epoxy resin such as a 3,3',5,5'-tetramethyl-4,4'-biphenol type epoxy resin and a 4,4'-biphenol type epoxy resin, a novolac type epoxy resin such as a phenol novolac type epoxy resin, a cresol novolac type epoxy resin, and a bisphenol A novolac type epoxy resin, an epoxy resin obtained by hydrogenating an aromatic ring of a naphthalene diol type epoxy resin, a tris phenylolmethane type epoxy resin, a tetrakis phenylolethane type epoxy resin, or a phenol dicyclopentadiene novolac type epoxy resin, and a known epoxy resin that is liquid or solid at room temperature (25° C.), such as an alicyclic epoxy resin. If necessary, a predetermined amount of an epoxy resin other than those described above can be also used together.

Since the uncured resin layer composed of the epoxy resin serves as the resin layer that seals the semiconductor devices, it is preferable to reduce halogen ions such as chlorine and alkali ions such as sodium as much as possible. When a sample of 10 g is added to 50 ml of ion-exchange water, the solution is sealed and left to stand still in an oven at 120° C. for 20 hours, and ions are extracted at 120° C. under heating, any of extracted ions is desirable to be 10 ppm or less.

A curing agent for epoxy resins can be contained in the uncured resin layer constituted of the epoxy resin. As the curing agent, it is possible to use, for example, a phenol novolac resin, various kinds of amine derivatives, an acid anhydride, or a curing agent obtained by partially ring opening an acid anhydride or an acid anhydride group to thereby generate a carboxylic acid. Among these, the phenol novolac resin is desirably used to secure reliability of the semiconductor apparatus manufactured using the sealant laminated composite according to the invention. In particular, it is preferable to mix the epoxy resin and the phenol novolac resin such that a mixing ratio of epoxy groups and phenolic hydroxyl groups is 1:0.8 to 1.3.

Additionally, to promote a reaction of the epoxy resin and the curing agent, as a reaction promoter, an imidazole derivative, a phosphine derivative, an amine derivative, or a metal compound such as an organic aluminum compound may be used, for example.

Various kinds of additives may be blended in the uncured resin layer constituted of the epoxy resin as required. For example, for the purpose of improving properties of the resin, it is possible to add and blend additives such as various kinds of thermoplastic resins, thermoplastic elastomers, organic synthetic rubbers, silicon-based low-stress agents, waxes, and halogen trapping agents.

[Silicone Resin]

As the silicone resin, a thermosetting silicone resin and others can be used. In particular, it is desirable for the uncured resin layer constituted of the silicone resin to contain an addition-curable silicone resin composition. As the addition-curable silicone resin composition, a composition having (A) an organosilicon compound having a non-conjugated double bond, (B) organohydrogenpolysiloxane, and (C) a platinum-based catalyst as essential components is particularly preferable. The components (A) to (C) will be described hereinafter.

Component (A): Organosilicon Compound Having Non-Conjugated Double Bond

The organosilicon compound having a non-conjugated double bond (A) may act as a base polymer (major agent) of a silicone resin composition, and examples of the component (A) may include a linear organopolysiloxane having a non-conjugated double bond such as an alkyenyl group on both terminals of a molecular chain, represented by a general formula (1):

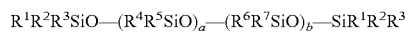

$R^1R^2R^3SiO-(R^4R^5SiO)_a-(R^6R^7SiO)_b-SiR^1R^2R^3$ wherein $R^1$ represents a non-conjugated double bond-containing monovalent hydrocarbon group, $R^2$ to $R^7$ each represent the same or different monovalent hydrocarbon group, and a and b represent integers satisfying $0 \leq a \leq 500$, $0 \leq b \leq 250$, and $0 \leq a+b \leq 500$.

In the general formula (1), $R^1$ is a non-conjugated double bond-containing univalent hydrocarbon group, which is preferably a non-conjugated double bond-containing univalent hydrocarbon group having an aliphatic unsaturated bond as typified preferably by a $C_2$ to $C_8$ alkenyl group, particularly preferably by a $C_2$ to $C_6$ alkenyl group.

In the general formula (1), $R^2$ to $R^7$ each are the same or different univalent hydrocarbon groups and exemplified preferably by a $C_1$ to $C_{20}$, particularly preferably $C_1$ to $C_{10}$ alkyl group, alkenyl group, aryl group, or aralkyl group. Further, among these, $R^4$ to $R^7$ each are more preferably a univalent hydrocarbon group excluding an aliphatic unsaturated bond, particularly preferably an alkyl group, an aryl group, or an aralkyl group that does not have an aliphatic unsaturated bond such as an alkenyl group. Furthermore, among these, $R^6$ and $R^7$ each are preferably an aromatic univalent hydrocarbon group, more preferably, a $C_6$ to $C_{12}$ aryl group such as a phenyl group or a tolyl group.

In the general formula (1), a and b are integers satisfying $0 \leq a \leq 250$, $0 \leq b \leq 250$, and $0 \leq a+b \leq 500$, and a preferably satisfies $10 \leq a \leq 500$, and particularly preferably $10 \leq a \leq 250$, b preferably satisfies $0 \leq b \leq 150$, and particularly preferably $0 \leq b \leq 100$, and a+b preferably satisfies $10 \leq a+b \leq 500$, and particularly preferably $10 \leq a+b \leq 250$.

The organopolysiloxane represented by the general formula (1) can be obtained by an alkali equilibration reaction between a cyclic diorganopolysiloxane such as a cyclic diphenylpolysiloxane or a cyclic methylphenylpolysiloxane and a disiloxane such as a diphenyltetravinyldisiloxane or a divinyltetraphenyldisiloxane, which constitutes a terminal group. However, in this case, polymerization that is an irreversible reaction proceeds by a small amount of catalyst in an equilibration reaction using an alkali catalyst (particularly strong alkali such as KOH), and as a result, ring-opening polymerization alone quantitatively proceeds. A terminal blocking ratio is high. Therefore, a silanol group and a chloride component are not usually contained.

Specific examples of the organopolysiloxane represented by the general formula (1) include as follows:

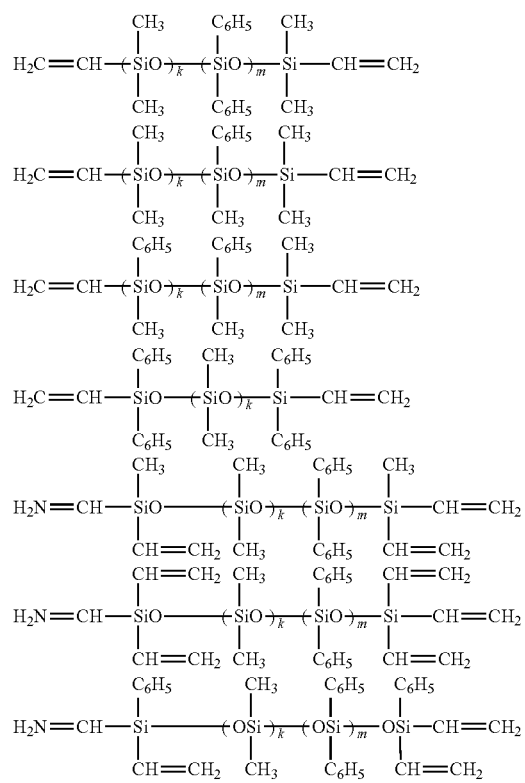

wherein k and m each represent an integer satisfying $0 \leq k \leq 500$, and particularly $5 \leq k \leq 250$, $0 \leq k \leq 250$, and particularly $0 \leq m \leq 100$, and $0 \leq k+m \leq 500$, preferably $5 \leq k+m \leq 250$, and more preferably $10 \leq k+m \leq 250$ and $0 \leq m/(k+m) \leq 0.5$.

As the component (A), other than organopolysiloxanes having a straight-chain structure represented by the general formula (1), as required, also organopolysiloxanes having a three-dimensional network structure including a trifunctional siloxane unit, a tetrafunctional siloxane unit, and the like can be used. The organosilicon compounds having a non-conjugated double bond (A) may be used singularly or in a combination of two or more kinds thereof.

The amount of a group (monovalent hydrocarbon group having a double bond bonded to a Si atom) having a non-conjugated double bond in the organosilicon compound having a non-conjugated double bond (A) is preferably 1 to 50% by mole in all monovalent hydrocarbon groups (all monovalent hydrocarbon groups bonded to Si atoms), more preferably 2 to 40% by mole, and particularly preferable 5 to 30% by mole. When the amount of the group having the non-conjugated double bond is 1% by mole or more, an excellent cured material can be obtained during curing. When it is 50% by mole or less, mechanical characteristics thereof are excellent during curing, and therefore this is preferable.

The organosilicon compound having a non-conjugated double bond (A) preferably have an aromatic monovalent hydrocarbon group (an aromatic monovalent hydrocarbon group bonded to a Si atom), such as an aryl group represented by a phenyl group. The content of the aromatic monovalent hydrocarbon group is preferably 0 to 95% by mole in all monovalent hydrocarbon groups (all monovalent hydrocarbon groups bonded to Si atoms), more preferably 10 to 90% by mole, and particularly preferably 20 to 80% by mole. A resin containing an appropriate amount of aromatic monovalent hydrocarbon group has an advantage of excellent mechanical characteristics during curing and easy manufacturing.

Component (B): Organohydrogenpolysiloxane

The component (B) may act as a cross-linker (curing agent) for a silicone resin component. The organohydrogenpolysiloxane as the component (B) is preferably an organohydrogenpolysiloxane having two or more, particularly three or more, and still particularly about 3 to about 100 hydrogen atoms bonded to silicon atoms (SiH groups) per molecule. The organohydrogenpolysiloxane having two or more hydrogen atoms bonded to silicon atoms (SiH groups) per molecule can act as a cross-linker. The SiH group in the component (B) is subjected to an addition reaction with the non-conjugated double bond-containing group such as a vinyl group or an alkenyl group in the component (A) to form a cured material.

The organohydrogenpolysiloxane (B) preferably have an aromatic monovalent hydrocarbon group, and particularly preferably an aryl group such as a phenyl group. Such an organohydrogenpolysiloxane (B) having an aromatic monovalent hydrocarbon group may have a high compatibility with the component (A). The organohydrogenpolysiloxanes (B) can be used alone or in a mixture of two or more kinds, and for example, an organohydrogenpolysiloxane (B) having an aromatic hydrocarbon group can be contained as a part or whole of the component (B).

Although not restricted, examples of the organohydrogenpolysiloxanes (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glysidoxypropyl-1,3,5,7-tetramethylcyclotetrasiloxane, 1,5-glysidoxypropyl-1,3,5,7-tetramethylcyclotetrasiloxane, 1-glysidoxypropyl-5-trimethoxysilylethyl-1,3,5,7-tetramethylcyclotetrasiloxane, methylhydrogenpolysiloxane having both molecular terminals capped with trimethylsiloxy groups, a dimethylsiloxane/methylhydrogensiloxane copolymer having both molecular terminals capped with trimethylsiloxy groups, dimethylpolysiloxane having both molecular terminals capped with dimethylhydrogensiloxy groups, a dimethylsiloxane/methylhydrogensiioxane copolymer having both molecular terminals capped with dimethylhydrogensiloxy groups, a methylhydrogensiloxane/diphenylsiloxane copolymer having both molecular terminals capped with trimethylsiloxy groups, a methylhydrogensiloxane/diphenylsiloxane/dimethylsiloxane copolymer having both molecular terminals capped with trimethylsiloxy groups, a trimethoxysilane polymer, a copolymer of a $(CH_3)_2HSiO_{1/2}$ unit and a $SiO_{4/2}$ unit, and a copolymer of a $(CH_3)_2HSiO_{1/2}$ unit, a $SiO_{4/2}$ unit, and a $(C_6H_5) SiO_{3/2}$ unit.

An organohydrogenpolysiloxane obtained by using units represented by the following structures can be also used.

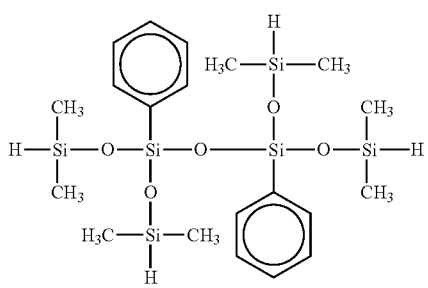

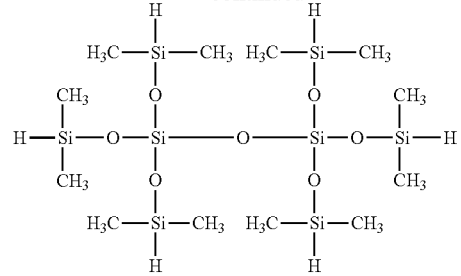

Examples of the organohydrogenpolysiloxane (B) may include as follows:

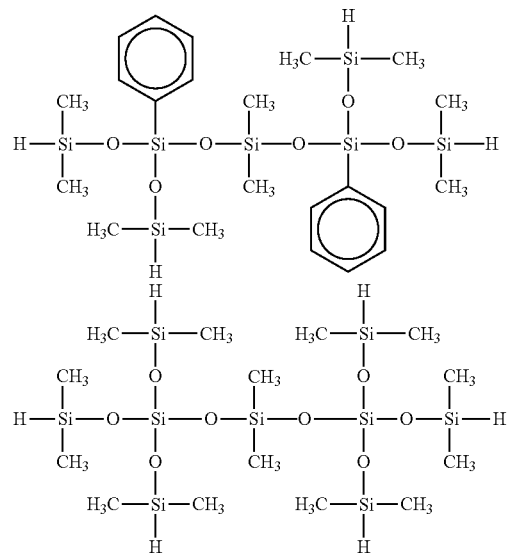

A molecular structure of the organohydrogensiloxane (B) may be any of a line chain structure, a cyclic structure, a branched chain structure, and a three-dimensional network structure. However, the number of silicon atoms per molecule (or the degree of polymerization in the case of a polymer) is preferably two or more, more preferably 2 to 1,000, and particularly preferably about 2 to about 300.

The amount of the organohydrogenpolysiloxane (B) to be blended is preferably such an amount that the number of hydrogen atoms bonded to silicon atoms (SiH group) in the component (B) per group having a non-conjugated double bond such as an alkenyl group in the component (A) is 0.7 to 3.0.

Component (C): Platinum-Based Catalyst

As the component (C), a platinum-based catalyst is used. Examples of the platinum-based catalyst (C) include chloroplatinic acid, alcohol-modified chloroplatinic acid, and a platinum complex having a chelate structure. These components can be used alone or in a combination of two or more kinds.

The amount of the platinum-based catalyst (C) to be blended may be a curing effective amount, that is, a so-called catalyst amount. It is preferable that the amount be generally in a range of 0.1 to 500 ppm, and particularly preferably 0.5 to 100 ppm in terms of weight of platinum group metal per 100 parts by mass in total of the components (A) and (B).

The uncured resin layer formed of the silicone resin becomes a resin layer for encapsulating a semiconductor device. Therefore, it is preferable that an ion of halogen such as chlorine and an ion of alkali such as sodium be reduced as much as possible. In general, it is desirable that the amount of ions be 10 ppm or less in extraction at 120° C.

[Mixed Resin of Epoxy Resin and Silicone Resin]

Examples of an epoxy resin and a silicone resin contained in the mixed resin include the epoxy resins and the silicone resins described above.

Since the uncured resin layer composed of the mixed resin serves as a resin layer for encapsulating semiconductor devices, it is preferable to reduce halogen ions such as chlorine and alkali ions such as sodium as much as possible. In general, the amount of ions is preferably 10 ppm or less in extraction at 120° C.

[Inorganic Filler]

The uncured resin layer of the present invention can be blended with an inorganic filler. Examples of the inorganic filler to be blended include silica such as molten silica and crystalline silica, alumina, silicon nitride, aluminum nitride, aluminosilicate, boron nitride, glass fiber, and antimony trioxide. The average particle diameter and the shape of the filler are not particularly limited.

In particular, the inorganic filler to be added into an uncured resin layer composed of an epoxy resin may be subjected to surface treatment in advance with a coupling agent, such as a silane coupling agent (e.g., alkoxysilane containing a monovalent hydrocarbon group substituted with a functional group such as an alkenyl group, an epoxy group, a (meth)acryloxy group, a mercapto group, an amino group, and an ureido group, and/or a partial hydrolytic condensate thereof), and a titanate coupling agent.

Preferable examples of such a coupling agent include epoxy functional alkoxysilane such as γ-glycidoxypropyltrimethoxysilane, γ-glycidoxypropylmethyldiethoxysilane, and β-(3,4-epoxycyclohexyl)ethyltrimethoxysilane; amino functional alkoxysilane such as N-γ(aminoethyl)-γ-aminopropyltrimethoxysilane, γ-aminopropyltriethoxysilane, and N-phenyl-γ-aminopropyltrimethoxysilane; or mercapto functional alkoxysilane such as γ-mercaptopropyltrimethoxysilane. The blending amount of the coupling agent used for the surface treatment and a method of the surface treatment are not particularly restricted.

The inorganic filler to be added into an uncured resin layer composed of a silicone resin composition may also be subjected to surface treatment in advance with the above coupling agent.

The amount of the inorganic filler to be blended is preferably 100 to 1,300 parts by mass, and particularly preferably 200 to 1,000 parts by mass per 100 parts by mass in total of a resin in the epoxy resin composition or the silicone resin composition. When the amount is equal to or more than 100 parts by mass, sufficient strength can be obtained. When it is equal to or less than 1,300 parts by mass, a reduction in flowability due to thickening can be suppressed, and a failure in filling properties caused by a reduction in flowability can be also suppressed. As a result, semiconductor devices formed on a wafer and semiconductor devices arranged and mounted on a substrate can be well encapsulated. The inorganic filler is preferably contained in a range of 50 to 95% by mass, and particularly 60 to 90% by mass of the entire composition constituting the uncured resin layer.

<Fiber-Containing Resin Substrate>

FIG. 1 shows an example of a cross-sectional view of a fiber-containing resin substrate of the present invention. The fiber-containing resin substrate 10 has the resin-impregnated fibrous base material 1 and the uncured resin layer 2. As described above, the resin-impregnated fibrous base material 1 is produced by impregnating a fibrous base material with a thermosetting resin and semi-curing or curing the thermosetting resin and has a linear expansion coefficient (ppm/° C.) in an X-Y direction of less than 3 ppm. The uncured resin layer 2 is composed of an uncured thermosetting resin formed on one side of the resin-impregnated fibrous base material.

[Method for Producing Fiber-Containing Resin Substrate]

The fiber-containing resin substrate of the invention may be produced by using a resin-impregnated fibrous base material produced by impregnating a fibrous base material with a thermosetting resin and semi-curing the thermosetting resin. In this production, an uncured resin layer, which is solid at 50° C. or lower, is formed by applying a thermosetting resin, such as a liquid epoxy resin or a silicone resin, to one side of the resin-impregnated fibrous base material through printing or dispensing under reduced pressure or vacuum and then heating the resin.

When a thermosetting epoxy resin is used as the thermosetting resin impregnated in the fibrous base material in the above production, the uncured thermosetting resin formed on the resin-impregnated fibrous base material is preferably composed of an epoxy resin. When the semi-cured thermosetting resin impregnated in the fibrous base material and the thermosetting resin of the uncured resin layer are composed of the same kind of thermosetting resin, both the resins can be cured at the same time when the device-forming surface or the device-forming surface are collectively encapsulated. As a result, the uncured resin layer advantageously provide a firmer encapsulation performance. Similarly, when a silicone resin is used as the thermosetting resin impregnated in the fibrous base material, the uncured thermosetting resin is preferably composed of a silicone resin.

The fiber-containing resin substrate of the invention may also be produced by using a resin-impregnated fibrous base material produced by impregnating a fibrous base material with a thermosetting resin and curing the thermosetting resin. In this production, the uncured resin layer may be formed according to various methods that have been conventionally used for an epoxy thermosetting resin or a silicone thermosetting resin, such as press molding or printing an uncured thermosetting resin on one side of the resin-impregnated fibrous base material. After the formation, the uncured resin layer is preferably post-cured commonly at a temperature of about 180° C. for 4 to 8 hours.

In addition, as another method for forming the uncured resin layer formed of the uncured thermosetting resin on one side of the resin-impregnated fibrous base material, there are a method wherein an epoxy thermosetting resin or a silicone thermosetting resin that is solid at room temperature is pressurized under heating, and a method wherein an epoxy resin composition is liquefied by adding an appropriate amount of polar solvent such as acetone, and printed to form a thin film, and the solvent is removed by a process including heating under reduced pressure to uniformly form an uncured resin layer on one side of the resin-impregnated fibrous base material.

According to any of the methods, an uncured resin layer formed of an uncured thermosetting resin that is free of voids and volatile components and has a thickness of about 20 to 2,000 μm can be formed on one side of the resin-impregnated fibrous base material.

[Semiconductor-Device-Mounting Substrate and Semiconductor-Device-Forming Wafer]

Figure 2A:
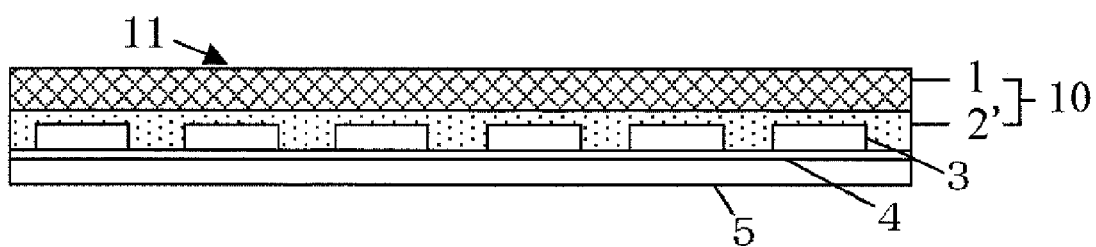
FIG. 2A is an example of a cross-sectional view of a semiconductor-device-mounting substrate encapsulated with a fiber-containing resin substrate of the invention.
Figure 2B:
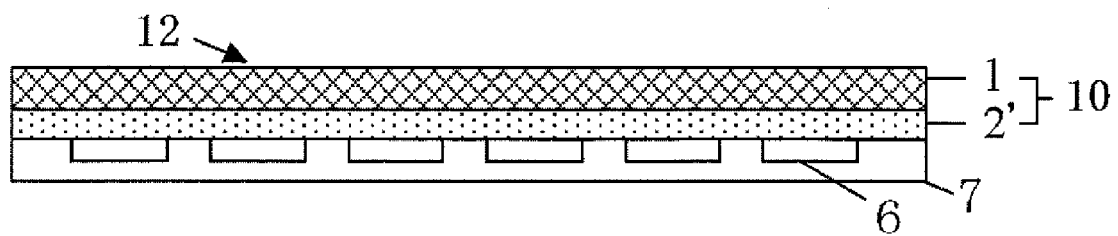
FIG. 2B is an example of a cross-sectional view of a semiconductor-device-forming wafer encapsulated with a fiber-containing resin substrate of the invention.

The fiber-containing resin substrate is used for collectively encapsulating the device-mounting surface of the semiconductor-device-mounting substrate or the device-forming surface of the semiconductor-device-forming wafer. Examples of the device-mounting substrate include an inorganic, metal, or organic substrate 5 on which semiconductor devices 3 are mounted through an adhesive 4, as shown in FIG. 2A. Examples of the device-forming wafer include a wafer 7 on which semiconductor devices 6 are formed, as shown in FIG. 2B. The semiconductor-device-mounting substrate include a semiconductor device array in which semiconductor devices are mounted and arranged.

<Encapsulated Semiconductor-Device-Mounting Substrate and Encapsulated Semiconductor-Device-Forming Wafer>

FIGS. 2A and 2B show examples of cross-sectional views of an encapsulated semiconductor-device-mounting substrate and an encapsulated semiconductor-device-forming wafer, which are encapsulated with the fiber-containing resin substrate of the present invention. In the encapsulated device-mounting substrate 11, the device-mounting surface of the substrate 5 on which the semiconductor devices 3 are mounted is covered with the uncured resin layer 2 (See FIG. 1) of the fiber-containing resin substrate 10, the uncured resin layer 2 (See FIG. 1) is heated and cured to provide a cured resin layer 2', and the device-mounting surface is collectively encapsulated with the fiber-containing resin substrate 10 (See FIG. 2A). In the encapsulated device-forming wafer 12, the device-forming surface of the wafer 7 on which the semiconductor devices 6 are formed is covered with the uncured resin layer 2 (See FIG. 1) of the fiber-containing resin substrate 10, the uncured resin layer 2 (See FIG. 1) is heated and cured to provide a cured resin layer 2', and the device-forming surface is collectively encapsulated with the fiber-containing resin substrate 10 (See FIG. 2B).

Such an encapsulated device-mounting substrate and an encapsulated device-forming wafer are prevented from warping, and the substrate prevents the semiconductor devices from peeling. The encapsulated wafer reduces its damage, even when a thin, large-diameter wafer with a diameter of 300 mm or more and a thickness ranging from 20 µm to 100 µm is used.

<Semiconductor Device>

Figure 3A:
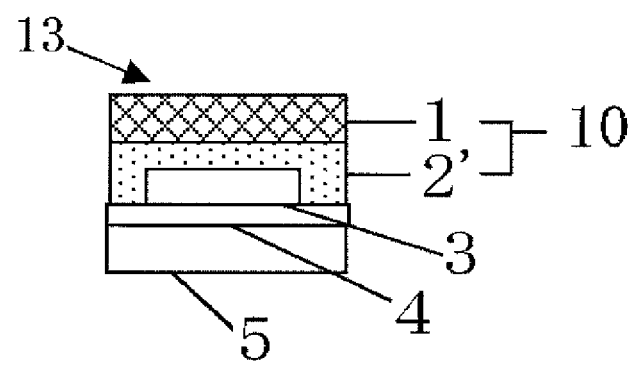
FIG. 3A is an example of a cross-sectional view of a semiconductor apparatus of the invention cut from an encapsulated semiconductor-device-mounting substrate.
Figure 3B:
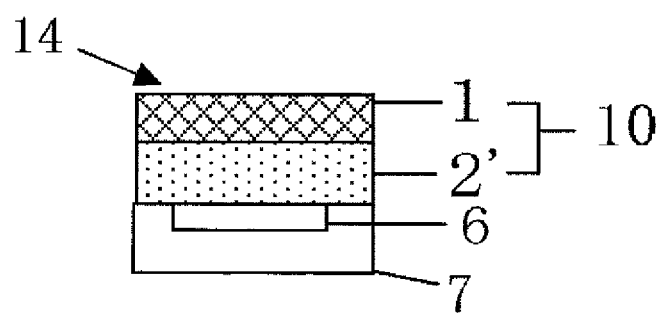
FIG. 3B is an example of a cross-sectional view of a semiconductor apparatus of the invention cut from an encapsulated semiconductor-device-forming wafer.

FIGS. 3A and 3B each show an example of a semiconductor apparatus of the present invention. The semiconductor apparatus 13 is obtained through cutting by dicing the encapsulated device-mounting substrate 11 (See FIG. 2A) or the encapsulated device-forming wafer 12 (See FIG. 2B) into individual pieces. The semiconductor apparatuses 13 and 14 have high quality, because the apparatuses are cutting by dicing the encapsulated device-mounting substrate 11 (See FIG. 2A) or the encapsulated device-forming wafer 12 (See FIG. 2B) into individual pieces, which is encapsulated with the fiber-containing resin substrate excellent in encapsulation performance such as heat resistance and moisture resistance, prevented from warping, and suppress peeling of the semiconductor device 3 from the substrate. In the semiconductor apparatus 13 cut from the encapsulated device-mounting substrate 11 (See FIG. 2A), the semiconductor device 3 mounted on the substrate 5 through the adhesive 4 is encapsulated with the fiber-containing resin substrate 10 including the cured resin layer 2' and the resin-impregnated fibrous base material 1 (See FIG. 3A). In the semiconductor apparatus 14 cut from the encapsulated device-forming wafer 12 (See FIG. 23), the semiconductor device 6 formed on the wafer 7 is encapsulated with the fiber-containing resin substrate 10 including the cured resin layer 2' and the resin-impregnated fibrous base material 1 (See FIG. 3B).

<Method for Producing Semiconductor Apparatus>

The present invention provides a method for producing a semiconductor apparatus including steps of covering the device-mounting surface of the device-mounting substrate or the device-forming surface of the device-forming wafer with the uncured resin layer of the fiber-containing resin substrate; encapsulating the device-mounting surface or the device-forming surface collectively by heating and curing the uncured resin layer to form the encapsulated device-mounting substrate or the encapsulated device-forming wafer; and cutting the encapsulated device-mounting substrate or the encapsulated device-forming wafer by dicing into individual pieces of the semiconductor apparatus. The method for producing a semiconductor apparatus of the invention will be described below with reference to FIG. 4.

[Covering Step]

Figure 4:
FIG. 4 is an example of a flow-chart of a method for producing a semiconductor apparatus with a fiber-containing resin substrate of the invention from a substrate on which semiconductor devices are mounted.
Figure 4:
Figure 4:
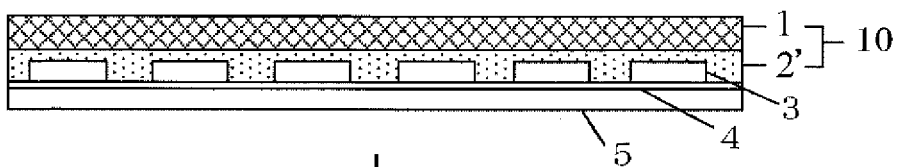
Figure 4:
Figure 4:
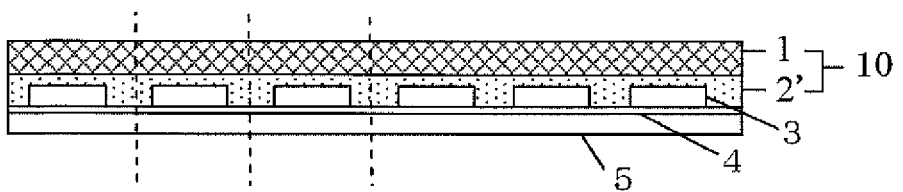
Figure 4:
Figure 4:
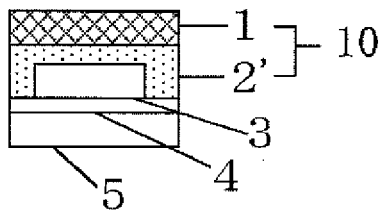

In the covering step of the method for producing a semiconductor apparatus (FIG. 4 at (A)), the device-mounting surface of the substrate 5 on which the semiconductor devices 3 are mounted through the adhesive 4, or the device-forming surface of the device-forming wafer (not shown) is covered with the uncured resin layer 2 of the fiber-containing resin substrate 10 having the resin-impregnated fibrous base material 1 and the uncured resin layer 2.

[Encapsulating Step]

In the encapsulating step of the method for producing a semiconductor apparatus (FIG. 4 at (B)), the device-mounting surface of the substrate 5 on which the semiconductor devices 3 are mounted or the device-forming surface of the device-forming wafer (not shown) is collectively encapsulated by heating and curing the uncured resin layer 2 of the fiber-containing resin substrate 10 to form a cured resin layer 2'. As a result, the encapsulated device-mounting substrate 11 or the encapsulated device-forming wafer (not shown) is provided.

[Cutting Step]

In the cutting step of the method for producing a semiconductor apparatus (FIG. 4 at (C) and (D)), the encapsulated device-mounting substrate 11 or the encapsulated device-forming wafer (not shown) is cut into individual semiconductor apparatus 13, 14 (See FIG. 3B).

The method for producing a semiconductor apparatus will be more specifically described below. In the covering step and the encapsulating step, when a vacuum lamination apparatus used in lamination of a solder resist film or various insulator films is used, covering and encapsulating without void and warp can be performed. As a lamination process, any process of roll lamination, diaphragm type vacuum lamination, and air-pressure lamination can be used. Among these, the vacuum lamination and the air-pressure lamination are preferably used in combination.

Here, a description will be given of an example of using a vacuum lamination apparatus manufactured by Nichigo-Morton Co., Ltd., to encapsulate a silicon wafer having a thickness of 70 µm and a diameter of 300 mm (12 inches) with a silicone resin-impregnated fibrous base material in which a glass cloth (fibrous base material) with a thickness of 50 µm is impregnated with a silicone resin and a fiber-containing resin substrate having an uncured resin layer formed of an uncured thermosetting silicone resin having a thickness of 50 µm on one side.

Of plates that have upper and lower built-in heaters and are set to 150° C., the upper plate has a diaphragm rubber closely attached to the heater under reduced pressure. A silicon wafer having a diameter of 300 mm (12 inches) is set on the lower plate, and the fiber-containing resin substrate is set on one side of this silicon wafer so that the uncured resin layer surface is fit into the semiconductor-device-forming surface of the silicon wafer. After then, the lower plate is moved up, the upper and lower plates are closely attached to each other to form a vacuum chamber by an O-ring installed so as to surround the silicon wafer set on the lower plate, and the pressure in the vacuum chamber is reduced. When the pressure in the vacuum chamber is sufficiently reduced, a valve of a pipe connecting a vacuum pump with a space between the diaphragm rubber of the upper plate and the heater is closed to send compressed air. As a result, the upper diaphragm rubber inflates to sandwich the silicon wafer and the fiber-containing resin substrate between the upper diaphragm rubber and the lower plate, and vacuum lamination and curing of the resin layer formed of the thermosetting silicone resin simultaneously progress. Thus, encapsulating is completed. A curing time of about 3 to 20 minutes is sufficient. After the vacuum lamination is completed, the pressure in the vacuum chamber is restored to normal pressure, the lower plate is moved down, and the encapsulated silicon wafer is taken out. The wafer can be encapsulated without void or warp by the above-described process. When the taken silicon wafer is usually post-cured at a temperature of 150 to 180° C. for 1 to 4 hours, electrical characteristics or mechanical characteristics can be stabilized.

The covering and encapsulating steps using the vacuum lamination apparatus are not restricted to use of the illustrated silicone resin, and they can be also used for the epoxy resin or a mixed resin of epoxy and silicone.

According to such a method for producing a semiconductor apparatus, the semiconductor-device-mounting surface or the semiconductor-device-forming surface can be simply covered with the uncured resin layer of the fiber-containing resin substrate of without a failure in filling in the covering step. Further, since the fiber-containing resin substrate is used, the resin-impregnated fibrous base material can suppress the contraction stress of the uncured resin layer during curing. The device-mounting surface or the device-forming surface can therefore be collectively encapsulated in the encapsulating step. Even when a thin large-diameter wafer or a large-diameter substrate made of metal or the like is encapsulated, the encapsulated semiconductor-device-mounting substrate or the encapsulated semiconductor-device-forming wafer which suppresses warping of the substrate or the wafer and peeling of the semiconductor device from the substrate can be obtained. Furthermore, in the dicing step, the encapsulated device-mounting substrate or the encapsulated device-forming wafer which is encapsulated with the fiber-containing resin substrate excellent in encapsulation performance such as heat resistance and humidity resistance and suppresses warping can be diced into individual pieces. Thus, the method is a method capable of producing a high-quality semiconductor apparatus.

EXAMPLES

Hereinafter, the present invention will be more specifically described with reference to Examples and Comparative Examples, but the present invention is not limited to these Examples.

Example 1

Production of Resin-Impregnated Fibrous Base Material

With a planetary mixer, 60 parts by mass of cresol novolak type epoxy resin (EOCN1020, available from Nippon Kayaku Co., Ltd.) and 30 parts by mass of phenol novolak resin (H-4, available from Gun Ei Chemical Industry Co., Ltd.) were dissolved in 400 parts by weight of methyl ethyl ketone (MEK), and then 700 parts by mass of spherical silica (available from Tatumori Ltd., average particle size: 7 μm), 0.6 parts by mass of imidazole catalyst (2E4MZ, available from Shikoku Chemicals Corporation), and 0.5 parts by mass of silane coupling agent (KBM403, available from Shin-Etsu Chemical Co., Ltd.) were added thereto, and the resultant mixture was sufficiently stirred to obtain a dispersion of epoxy resin composition in MEK.

A quartz glass cloth (available from Shin-Etsu Quartz Products Co., Ltd., thickness: 50 μm) as a fibrous base material was immersed in the dispersion of epoxy resin composition in MEK, to impregnate the glass cloth with the MEK dispersion. The glass cloth was left at 60° C. for 2 hours to volatilize MEK. After the volatilization of MEK, a solid coating film was formed at room temperature (25° C.) on both faces of the quartz glass cloth. The glass cloth was molded under pressure at 150° C. for 10 minutes with a hot press machine to obtain a molded product. The product was secondarily cured at 150° C. for 1 hour, to obtain a resin-impregnated fibrous base material (I-a-1) in which an impregnated thermosetting resin was cured. The linear expansion coefficient (ppm/° C.) in the X-Y direction of the resin-impregnated fibrous base material was 2 ppm.

The glass cloth was impregnated with the MEK dispersion, and left at 60° C. for 2 hours to volatilize MEK. The impregnated thermosetting resin was semi-cured to obtain a resin-impregnated fibrous base material (I-a-2). After the volatilization of DMF, a solid coating film was formed at room temperature (25° C.) on both faces of the quartz glass cloth.

[Production of Composition for Forming Uncured Resin Layer Formed of Uncured Thermosetting Resin]

With a high-speed mixer, 60 parts by mass of cresol novolak type epoxy resin (EOCN1020, available from Nippon Kayaku Co., Ltd.), 30 parts by mass of phenol novolak resin (H-4, available from Gun Ei Chemical Industry Co., Ltd.), 400 parts by mass of spherical silica (available from Tatumori Ltd., average particle size: 7 μm), 0.2 parts by mass of catalyst TPP (triphenylphosphine, available from Hokko Chemical Industry Co., Ltd.), and 0.5 parts by mass of silane coupling agent (KBM403, available from Shin-Etsu Chemical Co., Ltd.) were sufficiently mixed. The resultant mixture was heated and kneaded with a continuous kneader, then formed into a sheet, and cooled. The sheet was pulverized and an epoxy resin composition (I-b) was obtained as a granular powder.

[Production of Fiber-Containing Resin Substrate]

The semi-cured epoxy resin-impregnated fibrous base material (I-a-2) was set on a lower mold of a compression molding machine capable of heating and pressurizing under reduced pressure, and a granular powder of the epoxy resin composition (I-b) was uniformly dispersed on the base material. The temperature of upper and lower molds was set to 80° C., a fluororesin-coated PET film (release film) was set on the upper mold, and the inside pressure of the mold was reduced to a vacuum level. Compression molding was performed for 3 minutes so that a resin thickness was 80 μm to produce a fiber-containing resin substrate (I-c). After molding, the substrate was cut into a disc having a diameter of 300 mm (12 inches).

[Covering and Encapsulating of Wafer on which Semiconductor Device is Formed]

Next, a vacuum lamination apparatus (manufactured by Nichigo-Morton Co., Ltd.) of which a plate temperature was set to 130° C. was used to perform covering and encapsulating. First, a silicon wafer having a diameter of 300 mm (12 inches) and a thickness of 70 μm was set on a lower plate, and covered with the epoxy resin composition (I-b) surface that was an uncured resin layer of the fiber-containing resin substrate (I-c) from which the release film was removed so that the composition surface was fitted to a silicon wafer surface.

The plate was then closed and vacuum compression molding was performed for 5 minutes to cure and encapsulate. After curing and encapsulating, a silicon wafer that was encapsulated with the fiber-containing resin substrate (I-c) was further post-cured at 150° C. for 2 hours, to obtain an encapsulated semiconductor-device-forming wafer (I-d).

Example 2

With a high-speed mixer, 60 parts by mass of cresol novolak type epoxy resin (EOCN1020, available from Nippon Kayaku Co., Ltd.), 30 parts by mass of phenol novolak resin (H-4, available from Gun Ei Chemical Industry Co., Ltd.), 300 parts by mass of spherical silica (available from Tatumori Ltd., average particle size: 7 μm), 0.2 parts by mass of catalyst TPP (triphenylphosphine, available from Hokko Chemical Industry Co., Ltd.), and 0.5 parts by mass of silane coupling agent (KBM403, available from Shin-Etsu Chemical Co., Ltd.) were sufficiently mixed. The resultant mixture was heated and kneaded with a continuous kneader, then formed into a sheet, and cooled. The sheet was pulverized to obtain an epoxy resin composition (II-b) as a granular powder.
[Production of Fiber-Containing Resin Substrate]

The semi-cured epoxy resin-impregnated fibrous base material (II-a) produced in the same manner as in Example 1 was set on a lower mold of a compression molding machine capable of heating and pressurizing under reduced pressure, and a granular powder of the epoxy resin composition (II-b) was uniformly dispersed on the base material. The temperature of upper and lower molds was set to 80° C., a fluororesin-coated PET film (release film) was set on the upper mold, and the inside pressure of the mold was reduced to a vacuum level. Compression molding was performed for 3 minutes so that a resin thickness was 80 μm to produce a fiber-containing resin substrate (II-c). After molding, the substrate was cut into a disc having a diameter of 300 mm (12 inches).
[Covering and Encapsulating of Wafer on which Semiconductor Device is Formed]

Next, a vacuum lamination apparatus (manufactured by Nichigo-Morton Co., Ltd.) of which a plate temperature was set to 130° C. was used to perform covering and encapsulating. First, a silicon wafer having a diameter of 300 mm (12 inches) and a thickness of 70 μm was set on a lower plate, and covered with the epoxy resin composition (I-b) surface that was an uncured resin layer of the fiber-containing resin substrate (II-c) from which the release film was removed so that the composition surface was fitted to a silicon wafer surface. The plate was then closed and vacuum compression molding was performed for 5 minutes to cure and encapsulate the wafer. After the curing and encapsulating, a silicon wafer encapsulated with the fiber-containing resin substrate (II-c) was further post-cured at 150° C. for 2 hours, to obtain an encapsulated semiconductor-device-forming wafer (II-d).

Example 3

Production of Resin-Impregnated Fibrous Base Material

A bismaleimide triazine (ET) resin substrate (glass transition temperature: 185° C.) having a thickness of 70 μm was prepared and used as a resin-impregnated fibrous base material (III-a). This substrate contained a fibrous base material of a glass cloth and spherical silica having a particle diameter of 0.3 μm to adjust its linear expansion coefficient (x and y axes) to 2.9 ppm.
[Production of Composition for Forming Uncured Resin Layer Formed of Uncured Thermosetting Resin]

With a high-speed mixer, 60 parts by mass of cresol novolak type epoxy resin (EOCN1020, available from Nippon Kayaku Co., Ltd.), 30 parts by mass of phenol novolak resin (H-4, available from Gun Ei Chemical Industry Co., Ltd.), 400 parts by mass of spherical silica (available from Tatumori Ltd., average particle size: 7 μm), 0.2 parts by mass of catalyst TPP (triphenylphosphine, available from Hokko Chemical Industry Co., Ltd.), and 0.5 parts by mass of silane coupling agent (KBM403, available from Shin-Etsu Chemical Co., Ltd.) were sufficiently mixed. The resultant mixture was heated and kneaded with a continuous kneader, then formed into a sheet, and cooled. The sheet was pulverized to obtain an epoxy resin composition (III-b) as a granular powder.
[Production of Fiber-Containing Resin Substrate]

The epoxy resin-impregnated fibrous base material (III-a) was set on a lower mold of a compression molding machine capable of heating and pressurizing under reduced pressure, and a granular powder of the epoxy resin composition (III-b) was uniformly dispersed on the base material. The temperature of upper and lower molds was set to 80° C., a fluororesin-coated PET film (release film) was set on the upper mold, and the inside pressure of the mold was reduced to a vacuum level. Compression molding was performed for 3 minutes so that a resin thickness was 80 μm to produce a fiber-containing resin substrate (III-c). After molding, the substrate was cut into a disc having a diameter of 300 mm (12 inches).
[Covering and Encapsulating of Wafer on which Semiconductor Device is Formed]

Next, a vacuum lamination apparatus (manufactured by Nichigo-Morton Co., Ltd.) of which a plate temperature was set to 170° C. was used to perform covering and encapsulating. First, a silicon wafer in which 400 pieces of silicone chips (shape: 5 mm×7 mm, thickness: 100 μm) were arranged and mounted on a metal substrate having a diameter of 300 mm (12 inches) and a thickness of 100 μm through an adhesive of which the adhesion force was reduced at a high temperature was set on a lower plate, and covered with the epoxy resin composition (III-b) surface that was an uncured resin layer of the fiber-containing resin substrate (III-c) from which the release film was removed so that the composition surface was fitted to a silicon wafer surface. The plate was then closed and vacuum compression molding was performed for 5 minutes to cure and encapsulate the wafer. After curing and encapsulating, the wafer was post-cured at 170° C. for 4 hours, to obtain an encapsulated semiconductor-device-forming wafer (III-d).

Comparative Example 1

Production of Resin-Impregnated Fibrous Base Material

With a planetary mixer, 60 parts by mass of cresol novolak type epoxy resin (EOCN1020, available from Nippon Kayaku Co., Ltd.) and 30 parts by mass of phenol novolak resin (H-4, available from Gun Ei Chemical Industry Co., Ltd.) were dissolved in 400 parts by weight of methyl ethyl ketone (MEK), and then 400 parts by mass of spherical silica (available from Tatumori Ltd., average particle size: 7 μm), 0.6 parts by mass of imidazole catalyst (2E4MZ, available from Shikoku Chemicals Corporation), and 0.5 parts by mass of silane coupling agent (KBM403, available from Shin-Etsu Chemical Co., Ltd.) were added. The resultant mixture was sufficiently stirred to obtain a dispersion of epoxy resin composition in MEK.

A quartz glass cloth (available from Shin-Etsu Quartz Products Co., Ltd., thickness: 50 μm) as a fibrous base material was immersed in the dispersion of epoxy resin composition in MEK, to impregnate the glass cloth with the MEK dispersion. The glass cloth was left at 60° C. for 2 hours to volatilize MEK. After the volatilization of MEK, a solid coating film was formed at room temperature (25° C.) on both faces of the quartz glass cloth. The glass cloth was molded under pressure at 150° C. for 10 minutes with a hot press machine to obtain a molded product. The product was secondarily cured at 150° C. for 1 hour, to obtain a resin-impregnated fibrous base material (IV-a) in which an impregnated thermosetting resin was cured. The linear expansion coefficient in the X-Y direction of the epoxy resin-impregnated fibrous base material (IV-a) was 16 ppm.

[Production of Composition for Forming Uncured Resin Layer Constituted of Uncured Thermosetting Resin]

With a high-speed mixer, 60 parts by mass of cresol novolak type epoxy resin (EOCN1020, available from Nippon Kayaku Co., Ltd.), 30 parts by mass of phenol novolak resin (H-4, available from Gun Ei Chemical Industry Co., Ltd.), 400 parts by mass of spherical silica (available from Tatumori Ltd., average particle size: 7 μm), 0.2 parts by mass of catalyst TPP (triphenylphosphine, available from Hokko Chemical Industry Co., Ltd.), and 0.5 parts by mass of silane coupling agent (KBM403, available from Shin-Etsu Chemical Co., Ltd.) were sufficiently mixed. The resultant mixture was heated and kneaded with a continuous kneader, then formed into a sheet, and cooled. The sheet was pulverized to obtain an epoxy resin composition (IV-b) as a granular powder.

[Production of Fiber-Containing Resin Substrate]

The epoxy resin-impregnated fibrous base material (IV-a) was set on a lower mold of a compression molding machine capable of heating and pressurizing under reduced pressure, and a granular powder of the epoxy resin composition (IV-b) was uniformly dispersed on the base material. The temperature of upper and lower molds was set to 80° C., a fluororesin-coated PET film (release film) was set on the upper mold, and the inside pressure of the mold was reduced to a vacuum level. Compression molding was performed for 3 minutes so that a resin thickness was 80 μm to produce a fiber-containing resin substrate (IV-c). After molding, the substrate was cut into a disc having a diameter of 300 mm (12 inches).

[Covering and Encapsulating of Wafer on which Semiconductor Device is Formed]

Next, a vacuum lamination apparatus (manufactured by Nichigo-Morton Co., Ltd.) of which a plate temperature was set to 130° C. was used to perform covering and encapsulating. First, a silicon wafer having a diameter of 300 mm (12 inches) and a thickness of 70 μm was set on a lower plate, and covered with the epoxy resin composition (IV-b) surface that was an uncured resin layer of the fiber-containing resin substrate (IV-c) from which the release film was removed so that the composition surface was fitted to a silicon wafer surface. The plate was then closed and vacuum compression molding was performed for 5 minutes to cure and encapsulate the wafer. After the curing and encapsulating, a silicon wafer encapsulated with the fiber-containing resin substrate (IV-c) was further post-cured at 150° C. for 2 hours, to obtain an encapsulated semiconductor-device-forming wafer (IV-d).

Comparative Example 2

Substrate on which Semiconductor Device is Mounted

On a metal substrate having a diameter of 300 mm (12 inches) and a thickness of 500 μm, 400 pieces of silicon chips (shape: 5 mm×7 mm, thickness: 125 μm) were arranged and mounted through an adhesive of which adhesion force was reduced at a high temperature.

[Covering and Encapsulating of Substrate on which Semiconductor Device is Mounted]

The substrate was set on a lower metal mold of a compression molding machine capable compression molding under reduced pressure, and a granular powder of the epoxy resin composition (V-b) fabricated in the same manner as that of Example 3 was uniformly dispersed. The temperature of upper and lower metal molds was set to 170° C., a fluororesin-coated PET film (release film) was set on the upper metal mold and the inside of the metal mold was depressurized to a vacuum level, and compression molding was performed for 3 minutes so that a resin thickness was 50 μm to cure and encapsulate. After curing and encapsulating, the substrate was post-cured at 170° C. for 4 hours, to obtain an encapsulated semiconductor-device-mounting substrate (V-d).

The encapsulated device-forming wafers (I-d) to (IV-d) and the encapsulated device-mounting substrate (V-d) in Examples 1 to 3 and Comparative Examples 1 and 2 were investigated for warp, appearance, an adhesion state of the resin and the substrate, and presence or absence of peeling of the semiconductor device from the metal substrate. The results are given in Table 1. The appearance was evaluated by whether a void or an unfilled state was present or not, and determined to be good when neither the void nor unfilled state were present. The adhesion state was determined to be good when the peeling during molding was not found.

TABLE 1

| | Example 1 | Example 2 | Example 3 | Comparative Example 1 | Comparative Example 2 |
|---|---|---|---|---|---|
| Appearance | Good | Good | Good | Good | Good |
| Warp of substrate (mm) | 0.8 | 0.9 | 0.5 | 10 | 8 |
| Adhesion state | Good | Good | Good | Good | Good |
| Appearance/void | None | None | None | None | Fine void |
| Appearance/not filling | None | None | None | None | None |
| Peeling from substrate/damage of wafer | — | — | — | Presence | Presence |
| Heating cycle test | No problem | No problem | No problem | Partial peeling | Partial peeling |
| Humidity resistance test | No problem | No problem | No problem | No problem | No problem |

The encapsulated device-mounting substrate and the encapsulated device-forming wafer in each of Examples 1 to 3 and Comparative Examples 1 and 2 were cut by dicing into individual pieces, and a heat resistance test and a humidity resistance test were performed on each semiconductor apparatus as follows: In the heat resistance test, a test piece was subjected to a heat cycle test (the test piece was held at −25° C. for 10 minutes and then held at 125° C. for 10 minutes, and this cycle was repeated 1,000 times). After the test, continuity was evaluated. In the humidity resistance test, a direct voltage of 10 V was applied to both poles of circuit of the test piece under conditions of a temperature of 85° C. and a relative humidity of 85%, and the occurrence of short circuit was evaluated with a migration tester (MIG-86, manufactured by IMV CORPORATION). The results revealed that the encapsulated device-forming wafers and the encapsulated device-mounting substrate in Examples 1 to 3 were excellent in heat resistance and humidity resistance.

The results of Comparative Examples 1 and 2, in which the resin-impregnated fibrous base material of the present invention was not used, revealed the following: In the case where the device-mounting surface and the device-forming surface were collectively encapsulated in a manner described in each of Comparative Examples, the encapsulated device-forming wafer (IV-d) and the encapsulated device-mounting substrate (V-d) greatly warped, the wafer (IV-d) was damaged, and some semiconductor devices were peeled from the substrate (V-d) (See Table 1). In Comparative Examples 1 and 2, some semiconductor devices were partially peeled in the heat cycle test.

On the contrary, the results of Examples 1 to 3 revealed that the encapsulated device-forming wafers (I-d) to (III-d), encapsulated with the fiber-containing resin substrate of the present invention, greatly suppressed its warping, were not damaged, had good appearance and good adhesion state, and had neither void nor an unfilled state. Thus, the resin-impregnated fibrous base material of the present invention can suppress the contraction stress during curing of the uncured resin, thereby enabling prevention of warping of a thin substrate and a thin wafer, the peeling of the semiconductor device from the substrate, and the damage of the wafer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A fiber-containing resin substrate for collectively encapsulating a semiconductor-device-mounting surface of a substrate on which semiconductor devices are mounted or a semiconductor-device-forming surface of a wafer on which semiconductor devices are formed, the resin substrate comprising:
   a resin-impregnated fibrous base material including:
       a fibrous base material; and
       a semi-cured or cured thermosetting resin impregnated in the fibrous base material,
       the resin-impregnated fibrous base material having a linear expansion coefficient in an X-Y direction of less than 3 ppm; and
   an uncured resin layer formed of an uncured thermosetting resin on one side of the resin-impregnated fibrous base material.

2. The fiber-containing resin substrate according to claim 1, wherein the uncured resin layer has a thickness ranging from 20 μm to 2,000 μm.

3. The fiber-containing resin substrate according to claim 1, wherein the uncured resin layer is formed of a thermosetting resin that is solidified at temperatures lower than 50° C. and molten at temperatures ranging from 50° C. to 150° C.

4. The fiber-containing resin substrate according to claim 2, wherein the uncured resin layer is formed of a thermosetting resin that is solidified at a temperatures lower than 50° C. and molten at temperatures ranging from 50° C. to 150° C.

* * * * *